United States Patent
Kakishima et al.

[19]

[11] Patent Number: 6,050,314
[45] Date of Patent: Apr. 18, 2000

[54] ADHESIVE APPLYING APPARATUS

[75] Inventors: Nobuyuki Kakishima, Kofu; Akihiko Wachi; Hitoshi Nakahira, both of Nakakoma-gun; Takayuki Mibuchi, Yokohama, all of Japan

[73] Assignee: Matsushita Electric Industrial Co., Ltd., Kadoma, Japan

[21] Appl. No.: 08/981,963

[22] PCT Filed: May 12, 1997

[86] PCT No.: PCT/JP97/01578

§ 371 Date: Jan. 12, 1998

§ 102(e) Date: Jan. 12, 1998

[87] PCT Pub. No.: WO97/43050

PCT Pub. Date: Nov. 20, 1997

[30] Foreign Application Priority Data

May 13, 1996 [JP] Japan .................................. 8-117380

[51] Int. Cl.$^7$ ................................ B05B 3/00; B05C 1/02
[52] U.S. Cl. ........................... 156/356; 156/64; 156/357; 118/256
[58] Field of Search .................................. 156/356, 357, 156/64; 118/256

[56] References Cited

U.S. PATENT DOCUMENTS

| | | | |
|---|---|---|---|
| 2,687,111 | 8/1954 | Deniston | 118/256 X |
| 4,564,410 | 1/1986 | Clitheros et al. | 156/64 |
| 4,762,578 | 8/1988 | Burgin, Jr. et al. | 156/356 X |
| 5,052,338 | 10/1991 | Maiorca et al. | 118/668 |
| 5,361,963 | 11/1994 | Ozawa et al. | 118/256 X |
| 5,362,354 | 11/1994 | Okura et al. | 156/356 |
| 5,804,019 | 9/1998 | Sweet et al. | 156/250 |
| 5,807,449 | 9/1998 | Hooker et al. | 156/64 |

FOREIGN PATENT DOCUMENTS

| | | |
|---|---|---|
| 63-54237 | 10/1988 | Japan . |
| 3-25916 | 2/1991 | Japan . |
| 4-37088 | 2/1992 | Japan . |
| 406188550 | 12/1992 | Japan . |
| 7-90193 | 10/1995 | Japan . |
| 409225399 | 2/1996 | Japan . |
| 409314013 | 5/1996 | Japan . |
| 9-68804 | 3/1997 | Japan . |

*Primary Examiner*—Curtis Mayes
*Assistant Examiner*—Sue A. Purvis
*Attorney, Agent, or Firm*—Wenderoth, Lind & Ponack, L.L.P.

[57] ABSTRACT

An adhesive applying apparatus having an adhesive applying nozzle (1), an elevation drive unit (B) for vertically moving the adhesive applying nozzle, a purging station (6) provided with a purging tape (5), a unit (10) for supporting a circuit board (4) and an X-Y direction drive unit (30) which moves the adhesive applying nozzle so as to position the adhesive applying nozzle in a specified position in a horizontal direction of the circuit board and the purging tape. The elevation drive unit is constructed so as to be able to selectively set the lowermost end position of the adhesive applying nozzle. Also, a control means (D) is provided for controlling the elevation drive unit with a command in order to set the lowermost end position of the adhesive applying nozzle, located in a position above the purging station, to a specified position.

8 Claims, 8 Drawing Sheets

ADHESIVE APPLYING APPARATUS

BACKGROUND OF THE INVENTION

1. Field of the Invention

The present invention relates to an adhesive applying apparatus for applying an adhesive for fixing an electronic component onto a circuit board.

2. Description of Related Art

A prior art adhesive applying apparatus will be described with reference to FIG. 6 and FIG. 7.

In FIG. 6, a reference character A denotes a perspective view of a prior art adhesive applying apparatus. The reference character B denotes an applying mechanism provided with applying nozzles 1 for applying an adhesive 3, a syringe 2 for supplying the adhesive 3 to the applying nozzles 1 and a monitor camera 13. The reference character C denotes a purging (discard) station mechanism provided with a purging tape 5 for purging the adhesive 3 and a purging station 6 which is located beside a circuit board conveyance unit 10 and places thereon the purging tape 5 in a purging stage. The aforementioned circuit board conveyance unit 10 and the purging station 6 are supported on an X-Y table 30. The circuit board conveyance unit 10 is constructed so as to be able to position the applying nozzle 1 in an X-Y direction.

An adhesive applying operation of the purging station to be executed by the prior art adhesive applying apparatus A prior to shipment from the factory will be described next with reference to FIG. 6 and FIG. 7.

Conventionally, when shipping an adhesive applying apparatus, an operator performs an adjustment for making the height of the upper surface of the purging tape 5 coincide with the height of the upper surface of a circuit board 4 conveyed by the circuit board conveyance unit 10 prior to shipment from the factory. This adjustment is performed by positioning the applying nozzle 1 above the purging station 6, moving the nozzle downward to a preset height corresponding to the upper surface of the aforementioned circuit board 4, loosening screws by which the purging station 6 is mounted so that the tip of the applying nozzle 1 is positioned in contact with the upper surface of the purging tape 5 on the purging station 6 within a stroke in which the board 4 and the nozzle 1 are in contact with each other as shown in FIG. 7, thereby vertically adjusting the position of the purging station 6.

However, in the aforementioned prior art construction, the adjustment of the height position of the purging station 6 and the circuit board 4 has required a significant amount of time. Furthermore, if the height of the upper surface of the purging tape 5 does not coincide with the height of the upper surface of the circuit board 4, conveyed by the circuit board conveyance unit 10, a problem occurs in that the appropriate purging cannot be performed because the tip of the applying nozzle 1 is separated from the upper surface of the purging tape 5 or the tip of the applying nozzle 1 collides with the purging station 6 via the purging tape 5.

The present invention has as an object to provide an adhesive applying apparatus which is capable of easily and speedily adjusting the vertical positional relationship between the upper surface of the circuit board and the upper surface of the purging station during the adjustment stage prior to shipment from the factory or when changing the type of circuit board.

SUMMARY OF THE INVENTION

In order to solve the aforementioned problems, the present invention is constructed as follows.

According to a first aspect of the present invention, there is provided an adhesive applying apparatus comprising an adhesive applying nozzle, and an elevation drive unit which moves the adhesive applying nozzle up and down and is able to set a lowermost end position of the adhesive applying nozzle.

The adhesive applying apparatus also includes a purging station provided with a purging tape placed on its upper surface, a support unit (10) for supporting a circuit board to be applied with an adhesive from the adhesive applying nozzle, and a transverse drive unit.

The adhesive applying nozzle is moved relative to the circuit board and the purging tape by the transverse drive unit so as to position the nozzle in a specified position in a transverse direction which is perpendicular to a vertical direction.

A control means is provided for controlling the elevation drive unit via a command to set the lowermost end position of the adhesive applying nozzle, located in a position above the purging station, to a specified position.

According to the present invention, the lowermost end position of the applying nozzle can be appropriately set in the position of the upper surface of the circuit board and in the position of the upper surface of the purging tape placed on the purging station. Therefore, the adhesive can be appropriately applied even when the upper surface of the circuit board does not coincide with the upper surface of the purging station.

According to a second aspect of the present invention, there is provided an adhesive applying apparatus based on the first aspect, wherein the elevation drive unit moves the adhesive applying nozzle down to the lowermost end position according to a thickness of the circuit board upon receiving a command from the control means for setting the lowermost end position of the adhesive applying nozzle to a height of the circuit board.

According to a third aspect of the present invention, there is provided an adhesive applying apparatus based on the first or second aspect, wherein the elevation drive unit is provided with a cam having a curved cam surface, a motor for rotating the cam, a cam follower which moves on the cam surface of the cam, and a shaft which is connected to the nozzle and moves up and down when the cam follower moves on the cam surface of the cam. The motor rotates in accordance with a command from the control means, consequently rotating the cam, moving the cam follower on the cam surface of the cam, moving the shaft in a downward direction and moving the adhesive applying nozzle down to the set lowermost end position.

According to a fourth aspect of the present invention, there is provided an adhesive applying apparatus based on the third aspect, wherein the cam has two cam surfaces of different curvatures so that the lowermost end position of the adhesive applying nozzle varies when the cam follower is moved on the two cam surfaces due to rotation of the motor.

According to a fifth aspect of the present invention, there is provided an adhesive applying apparatus comprising an adhesive applying nozzle, an elevation drive unit for moving the adhesive applying nozzle up and down, a purging station provided with a purging tape placed on its upper surface, and a support unit for supporting a circuit board to be applied with an adhesive from the adhesive applying nozzle.

The apparatus also has a transverse drive unit which moves the adhesive applying nozzle relative to the circuit board and the purging tape so as to position the nozzle in a specified position in a transverse direction perpendicular to a vertical direction.

A station elevation unit is provided for moving the purging station up and down.

Also, a control means is provided for controlling the station elevation unit via a command so as to set a height of the purging station to a specified height.

According to the present invention, the height position of the purging station can be easily and speedily adjusted when a displacement occurs between the position of the upper surface of the circuit board and the position of the upper surface of the purging tape placed on the purging station. Therefore, appropriate purging can be performed.

According to a sixth aspect of the present invention, there is provided an adhesive applying apparatus based on the fifth aspect, wherein the station elevation unit moves up and down relative to the purging station according to a thickness of the circuit board upon receiving the command for setting the height of the purging station to the height of the circuit board from the control means.

According to a seventh aspect of the present invention, there is provided an adhesive applying apparatus based on any of the fourth through sixth aspects. In the seventh aspect, the station elevation unit is provided with a motor and a threaded shaft which is driven by the motor to move the purging station up and down.

According to an eighth aspect of the present invention, there is provided an adhesive applying apparatus based on any of the first through seventh aspects. In the eighth aspect, the circuit board is supported by being positioned by the support unit with its lower surface serving as a reference, and the height of the upper surface of the circuit board is changed every time the thickness of the circuit board is varied.

BRIEF DESCRIPTION OF DRAWINGS

These and other objects and features of the present invention will be apparent from the following description in conjunction with the preferred embodiments thereof with reference to the accompanying drawings, in which.

DETAILED DESCRIPTION OF THE INVENTION

Figure 1A:
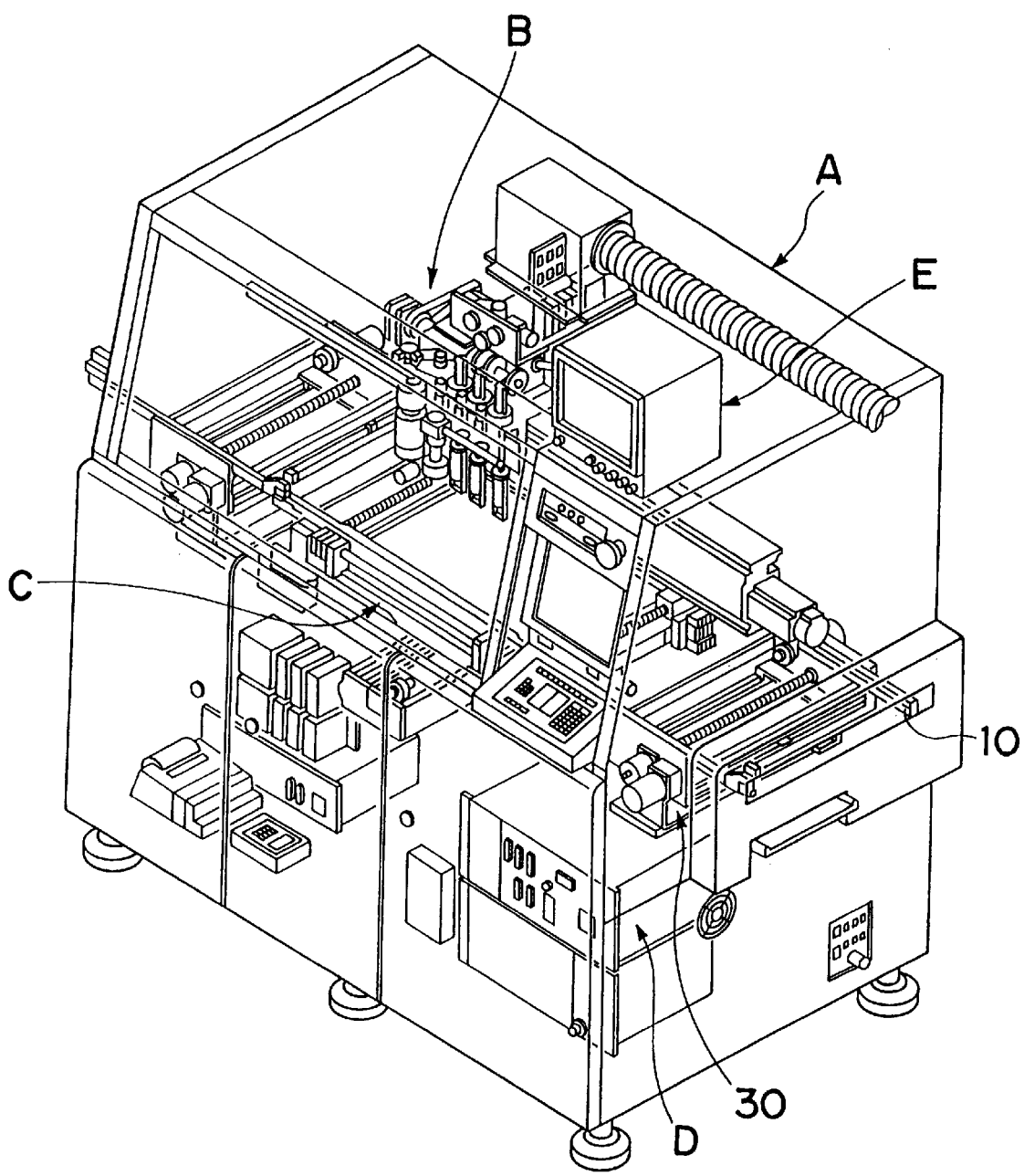
FIGS. 1A, 1B and 1C are perspective views of the whole body and essential parts of an adhesive applying apparatus according to a first embodiment of the present invention.

Before continuing the description of the present invention, it is to be noted that the same components are denoted by the same reference numerals in the accompanying drawings.

An adhesive applying apparatus according to a first embodiment of the present invention will be described with reference to FIG. 1A through FIG. 5.

Figure 1B:
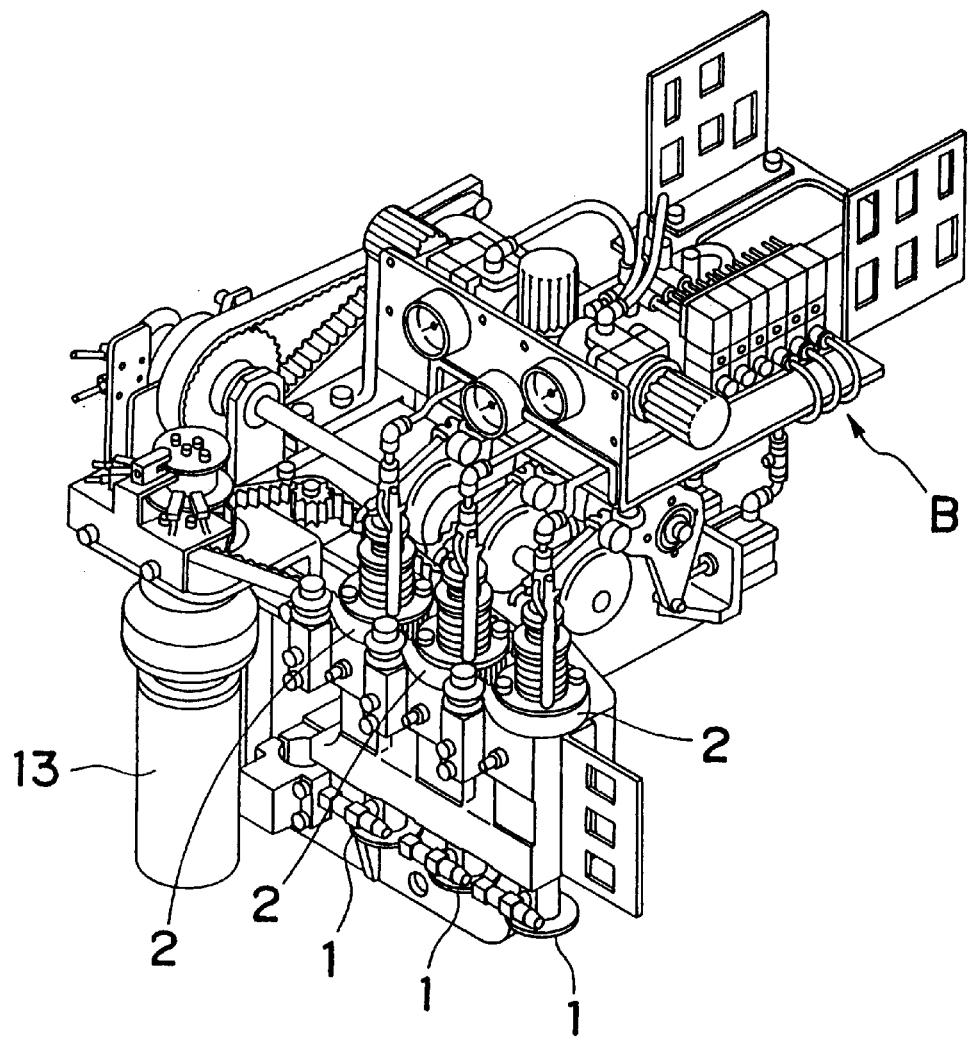
Figure 1C:
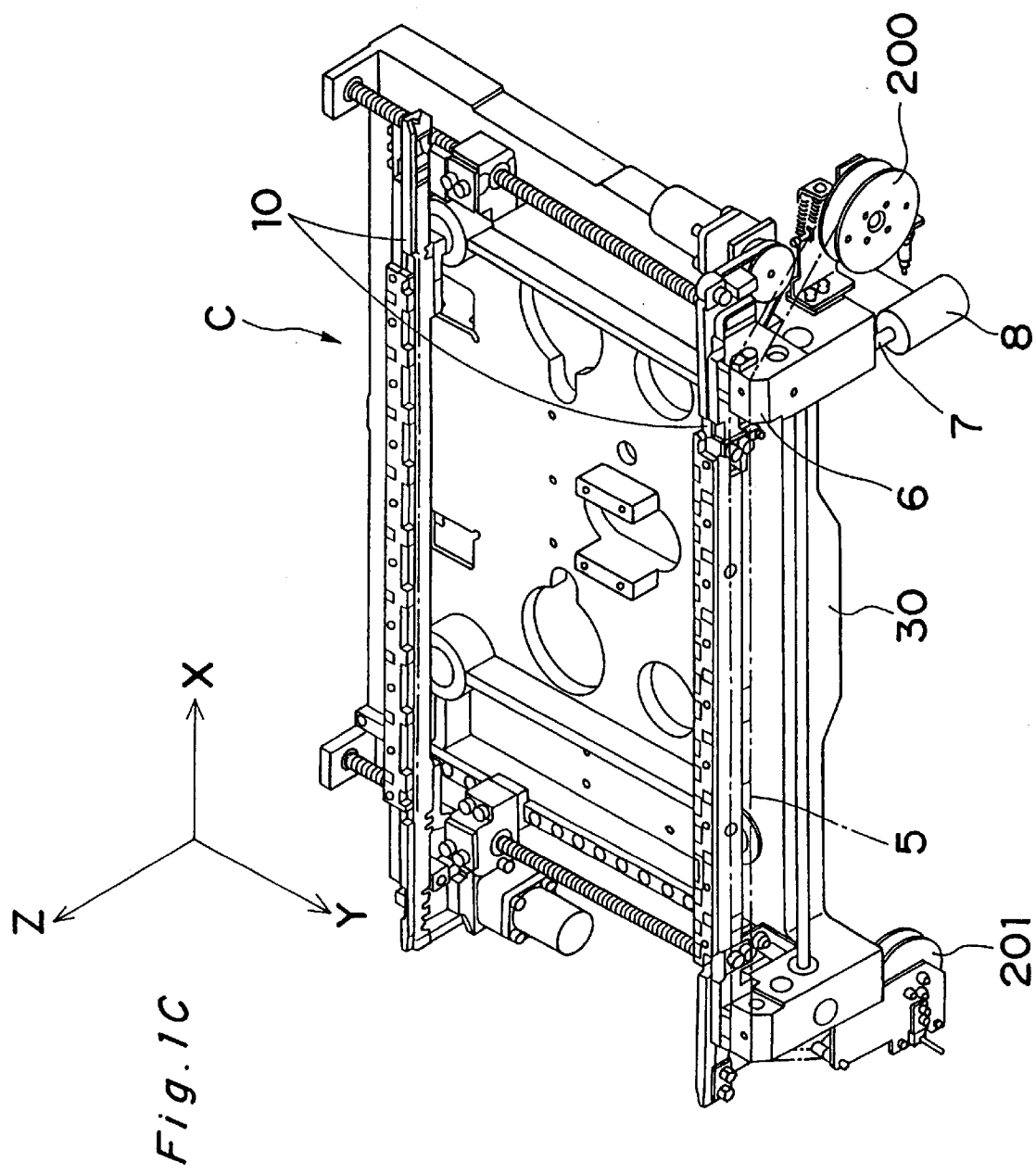

In FIGS. 1A, 1B and 1C, the reference character A denotes a perspective view of the adhesive applying apparatus of the first embodiment. The reference character B denotes an applying mechanism provided with a plurality of applying nozzles 1 for applying an adhesive 3, a plurality of syringes 2 for supplying the adhesive 3 to the plurality of applying nozzles 1, and a monitor camera 13.

The reference character C denotes a purging (discard) station mechanism provided with a purging tape 5 which purges the adhesive 3 while being rewound from a reel 200 and wound around a reel 201, and a purging station 6 which is located beside a circuit board conveyance unit 10 of an example of a circuit board support unit and on which the purging tape 5 is placed in a purging stage. A ball thread shaft 7 rotates to vertically move the purging station 6 so as to position the station in the vertical direction (Z direction). Also, a vertical movement motor 8 is provided for rotating the ball thread shaft 7. The aforementioned circuit board conveyance unit 10 and purging station 6 are supported on an X-Y table 30 of an example of a transverse drive unit for moving the applying nozzle 1 in a transverse direction, e.g., X-Y direction perpendicular to the vertical direction. The conveyance unit 10 and purging station are constructed so that they can be positioned in a horizontal direction (X-Y direction) relative to the applying nozzle 1.

Figure 4:
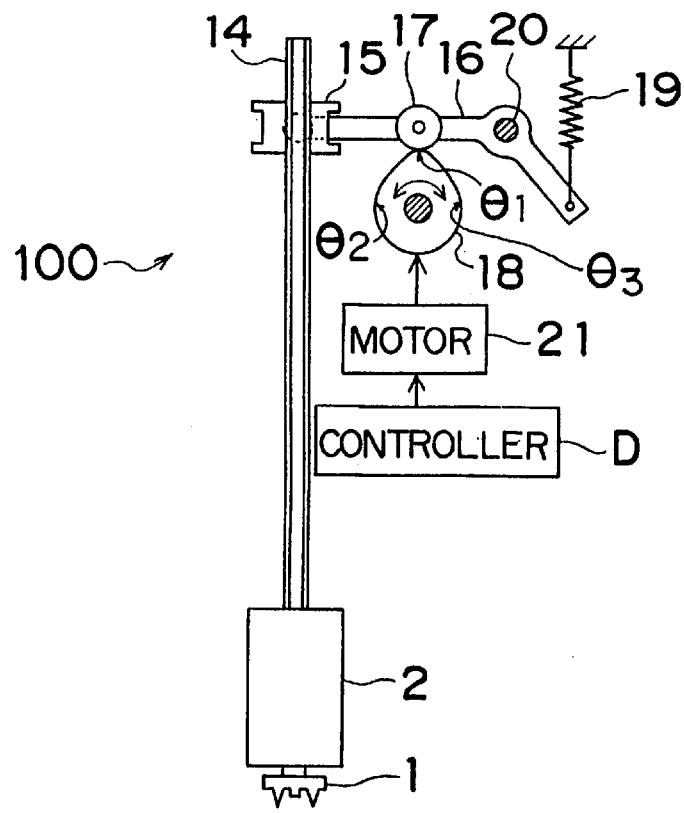
FIG. 4 is a schematic view showing an elevation drive unit for an adhesive applying nozzle of the adhesive applying apparatus of the first embodiment.

FIG. 4 shows the construction of an elevation drive unit 100 for moving the applying nozzle 1 up and down. The applying nozzle 1 and the syringe 2 are supported by a stroke shaft 14. The stroke shaft 14 is supported by a support fulcrum 15, and an arm 16 is pivotally supported by the support fulcrum 15. The arm 16 is pivotally supported at a fulcrum 20, and its end portion on the other side is biased by a spring 19. A cam follower 17 is provided halfway between the aforementioned support fulcrum 15 of the arm 16 and the aforementioned fulcrum 20, and a cam 18 is positioned so as to contact the lower side of the cam follower 17. The cam 18 is driven by a motor 21 which rotates in a forward direction and a reverse direction, and the motor 21 is controlled by a controller D. In this construction, the top dead center position and the bottom dead center position of the adhesive applying nozzle 1 are determined by a position of the cam 18 indicated by $\theta_1$ and a position of the cam 18 indicated by $\theta_2$. Then, by forwardly and reversely rotating the cam 18 within a range of $\theta_1$ to $\theta_2$, the lowermost end position of the applying nozzle 1 is determined. By arbitrarily determining $\theta_1$ and $\theta_2$, the aforementioned lowermost end position can be adjusted. The controller D instructs the motor 21 about the aforementioned reciprocation pivot angle range of $\theta_1$ to $\theta_2$. Further, with regard to cam 18, it is acceptable to provide a reciprocation pivot angle range of $\theta_1$ to $\theta_3$ having a curvature different from the aforementioned reciprocation pivot angle range of $\theta_1$ to $\theta_2$ in order to allow the adhesive applying nozzle 1 to be moved up and down with a stroke length which is greater than or smaller than the aforementioned reciprocation pivot angle range of $\theta_1$ to $\theta_2$, thereby allowing the lowermost end position of the applying nozzle 1 to be adjusted over a wider range.

Figure 5:
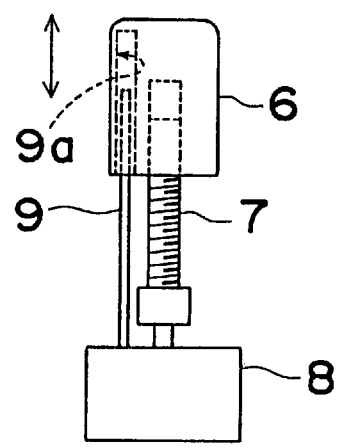
FIG. 5 is a side view showing the construction of a purging station of an adhesive applying apparatus according to a second embodiment of the present invention.
Figure 6:
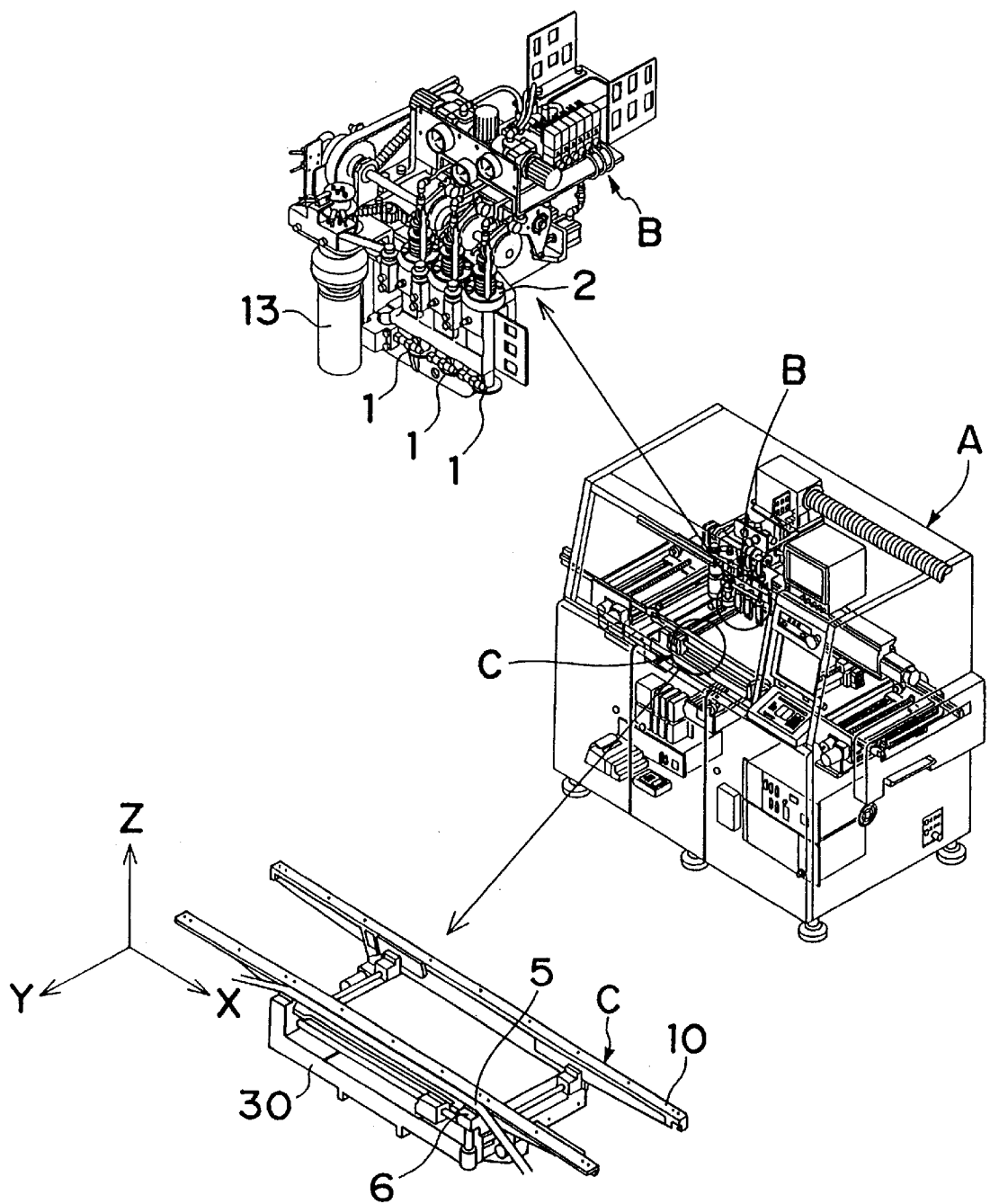
FIG. 6 is a perspective view of the whole body and essential parts of a prior art adhesive applying apparatus.
Figure 7:
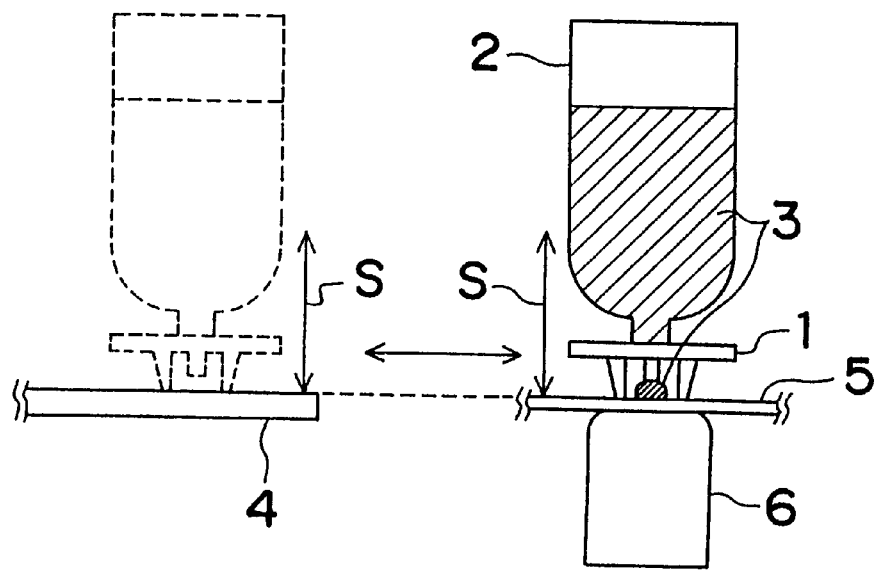
FIG. 7 is a side view showing the construction of a purging station of the prior art adhesive applying apparatus.

FIG. 5 shows the details of the purging station mechanism C. By forwardly and reversely rotating the ball thread shaft 7 mounted on the rotary shaft of the vertical movement motor 8, the purging station 6, which is meshed with the ball thread shaft 7, is moved in the vertical direction, and vertical guides 9 and 9a guide the purging station 6 in the vertical direction.

The reference character D denotes a controller which controls the whole body of the adhesive applying apparatus A and includes an X-Y direction positioning mechanism for positioning an applying point of the circuit board 4 and positioning the purging station 6 in the X-Y direction by positioning the X-Y table 30, an applying control mechanism for moving and positioning the applying nozzle 1 of the applying mechanism B in the Z direction and a purging station control mechanism for moving and positioning the purging station 6 in the vertical direction by controlling the vertical movement motor 8. The reference character E denotes a display unit which displays a control condition of the aforementioned applying control mechanism and a control condition of the aforementioned purging station control mechanism.

An adhesive applying operation in which the type of the circuit board is changed in the adhesive applying apparatus of the first embodiment will be described next with reference to FIG. 1A through FIG. 3.

In FIGS. 1A, 1B and 1C, when changing the type of circuit board 4, the viscosity and so forth of the adhesive inside the applying nozzle 1 are changed due to suspension of the applying operation. Therefore, it is necessary to stabilize the adhesive applying by consuming the adhesive at the viscosity changed portion by purging and confirming that a state in which appropriate applying is performed, by means of the monitor camera 13 before starting the applying work on the circuit board 4.

The purging operation of the first embodiment will now be described with reference to FIG. 2.

Figure 2:
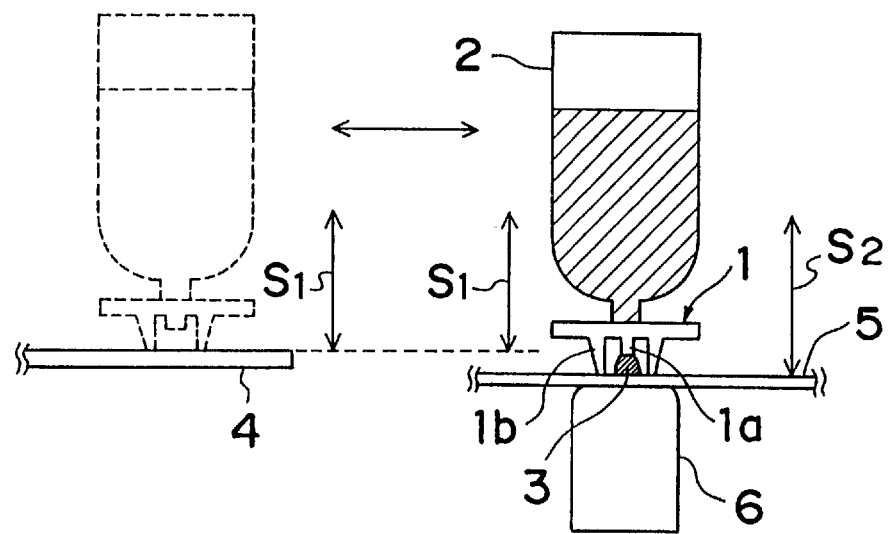
FIG. 2 is a view showing the operation of the adhesive applying apparatus of the first embodiment.

In FIG. 2, the controller D sets the aforementioned $\theta_1$ and $\theta_2$ so that a vertical stroke $S_1$ of the applying nozzle 1 is adjusted to the lowermost end position which coincides with the position of the upper surface of the circuit board 4 conveyed by the circuit board conveyance unit 10. At this stage, when the position of the upper surface of the purging tape 5, placed on the purging station 6, coincides with the position of the upper surface of the aforementioned circuit board 4, the purging operation can be performed without doing anything else. However, when the position of the upper surface of the purging tape 5 on the purging station 6 does not coincide with the position of the upper surface of the aforementioned circuit board 4, there is the issue that the tip of a positioning projection 1b of the applying nozzle 1 does not reach the upper surface of the purging tape 5 which results in an abnormal applying position, and the size and shape of the adhesive discharged from a nozzle opening 1a is affected. Also, the tip of the positioning projection 1b of the applying nozzle 1 may collide against the purging station 6 via the purging tape 5.

In the first embodiment, the controller D changes the aforementioned stroke $S_1$ according to the height position of the purging tape 5 placed on the purging station 6 so as to make it a purging stroke $S_2$, so that the tip of the positioning projection 1b of the applying nozzle 1 just coincides with the upper surface of a purging tape 5a.

With the above arrangement, the applying nozzle 1 moves downward by the stroke $S_2$, so that the tip of the positioning projection 1b of the applying nozzle 1 reaches the upper surface of the purging tape 5b, thereby the appropriate purging operation is performed. When the purging operation is completed, the vertical stroke $S_2$ of the applying nozzle 1 is reset by controller D back to the vertical stroke $S_1$, and then adhesive can be applied on the circuit board 4.

This arrangement obviates the need, as in the prior art, for the troublesome work of making the position of the upper surface of the purging tape 5 coincide with the position of the upper surface of the circuit board 4 by loosening screws and permits a change of the type of circuit board 4 to be performed easily and speedily.

The purging operation of the second embodiment of the present invention will be described next with reference to FIG. 3.

Figure 3:
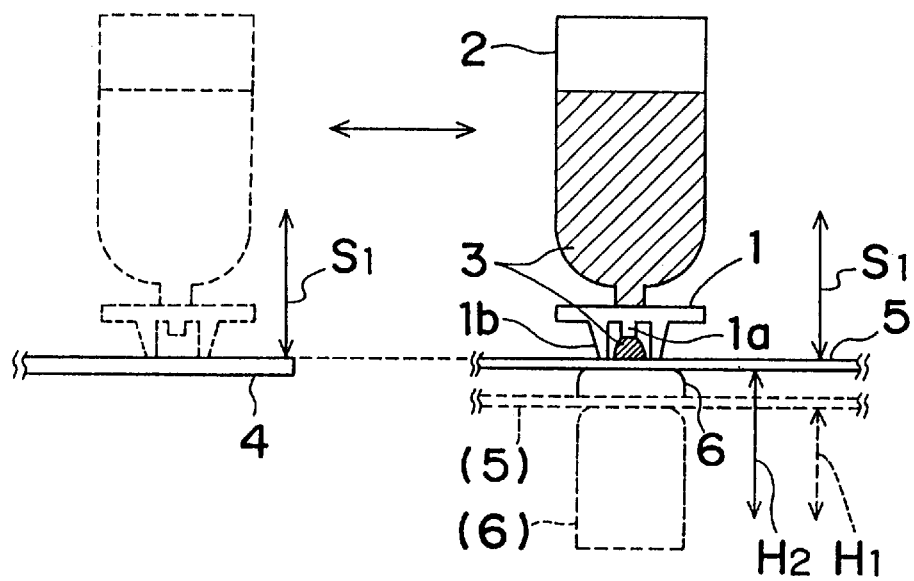
FIG. 3 is a view showing the operation of the adhesive applying apparatus of the first embodiment.

In FIG. 3, the vertical stroke $S_1$ of the applying nozzle 1 set by the controller D has a stroke length which is appropriate for the purging operation when the position of the upper surface of the circuit board 4 coincides with the position of the upper surface of the purging tape 5 on the purging station 6. Therefore, if the position of the upper surface of the purging tape 5 is lower than the position of the upper surface of the circuit board 4 as indicated by the dashed lines in FIG. 3, the tip of the positioning projection 1b of the applying nozzle 1 will not reach the upper surface of the purging tape 5 with the aforementioned vertical stroke $S_1$. This results in an abnormal applying position, affecting the size and shape of the adhesive discharged from the nozzle opening 1a.

In the second embodiment, the vertical stroke $S_1$ of the applying nozzle 1, set by the controller D, maintained, and a purging station control condition of the controller D is changed from a positioning condition $H_1$ in which the position of the upper surface of the purging tape 5 is lower than the position of the upper surface of the circuit board 4 to a positioning condition $H_2$ in which the position of the upper surface of the purging tape 5 coincides with the position of the upper surface of the circuit board 4. To change the positioning condition, vertical movement motor 8 shown in FIG. 4 is operated to rotate the ball thread shaft 7, thereby vertically moving the purging station 6 which is meshed with the ball thread shaft 7. The position of the upper surface of the purging tape 5 coincides with the position of the upper surface of the circuit board 4. With this arrangement, the appropriate purging operation can be performed with the vertical stroke $S_1$ set by the controller D is maintained.

Figure 8:
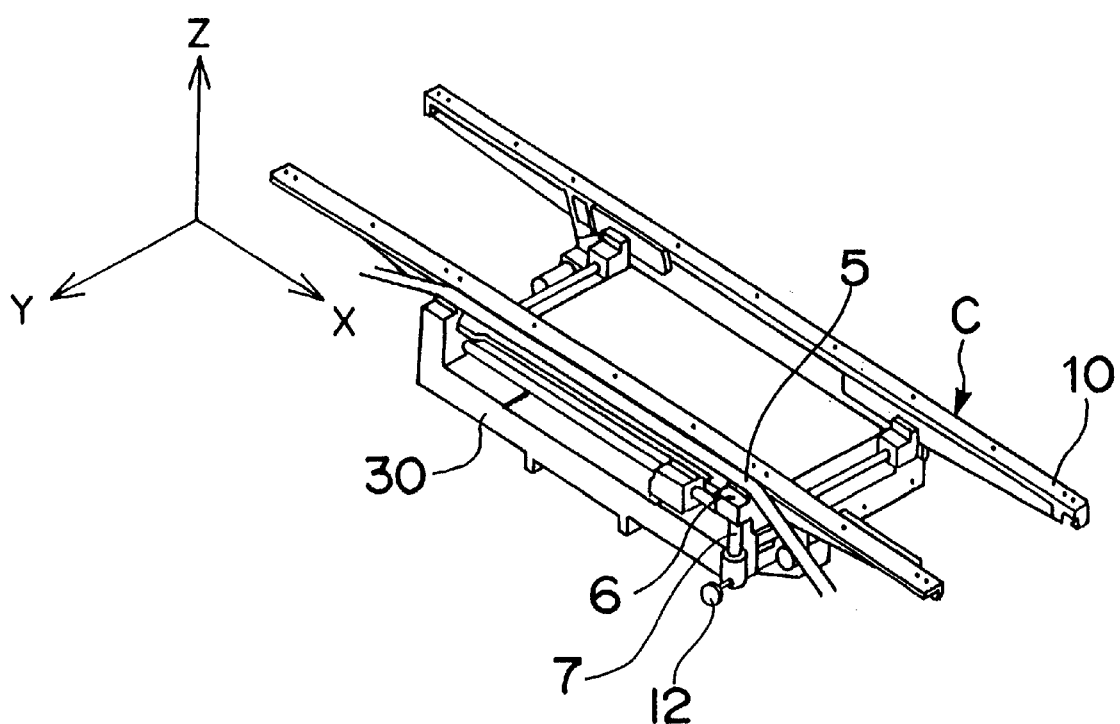
FIG. 8 is a perspective view of a purging station mechanism of an adhesive applying apparatus according to a third embodiment of the present invention.

As shown in FIG. 8, an adhesive applying apparatus, according to a third embodiment of the present invention, is provided with an operating knob 12 in place of the vertical movement motor 8 of the second embodiment. A ball thread shaft 11 can be rotated by forwardly and reversely rotating the operating knob 12, thereby vertically moving the purging station 6 in order to position it in the vertical direction.

The aforementioned embodiments can be applied to cases other than the case where height adjustment between the upper surface of a circuit board and the upper surface of the purging tape 5 is performed prior to shipment from the factory. That is, in a case where the circuit board 4 is changed to one having a different thickness and the circuit board 4 is supported by the circuit board conveyance unit 10 with the lower surface of the board 4 serving as a reference, and the height of the upper surface of the circuit board 4 differs from the height of the upper surface of the purging tape 5. In such a case, the adjustment of the lowermost end position of the aforementioned applying nozzle 1 or the adjustment of the position of the upper surface of the purging tape 5 of the purging station 6 according to the aforementioned embodiment can be performed.

The aforementioned adhesive applying apparatus is constructed so that the elevation drive unit of the adhesive applying nozzle can be selectively set to the lowermost end position of the adhesive applying nozzle. The control means controls the aforementioned elevation drive unit by a command for setting the lowermost end position of the adhesive applying nozzle located in a position above the purging station to a specified position. With this arrangement, the appropriate purging operation can be performed by easily and speedily adjusting the lowermost end position of the applying nozzle so as to make it appropriate for the purging operation even when a displacement occurs between the height positions of the upper surface of the circuit board and the upper surface of the purging station when the type of the circuit board is changed, resulting in improved productivity.

Furthermore, the aforementioned adhesive applying apparatus has the station elevation unit for moving the purging station and the control means for controlling the aforementioned station elevation unit to adjust the height of the purging station to the specified height. With this arrangement, the appropriate purging can be performed by easily and speedily adjusting the height position of the purging station so as to make it appropriate for the purging operation even when there exists difference in the height position between the upper surface of the circuit board and the upper surface of the purging station when the type of the circuit board is changed, so that productivity can be improved.

The entire disclosure of Japanese Patent Application No. 8-117380 filed on May 13, 1996, including specification, claims, drawings, and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. An adhesive applying apparatus comprising:
   a support unit for supporting a circuit board;
   an adhesive applying nozzle for applying adhesive on an upper surface of the circuit board;
   an elevation drive unit connected to said adhesive applying nozzle for moving said adhesive applying nozzle in a vertical direction toward and away from a lowermost position, wherein said elevation drive unit can be selectively controlled in order to adjust the lowermost position of said adhesive applying nozzle, wherein said elevation drive unit comprises
   a) a cam having two curved cam surfaces, each of said two cam surfaces having a different curvature,
   b) a reversible motor for rotating said cam,
   c) a cam follower which moves on the cam surfaces of said cam such that the specific lowermost position of said adhesive applying nozzle is dependent upon which of said two cam surfaces that said cam follower engages in response to rotation of said cam by said reversible motor, and
   d) a shaft connected to said adhesive applying nozzle and to said cam follower;
   a purging station having an upper surface for receiving a purging tape;
   a purging station elevation unit which includes a motor, and a threaded shaft rotatably connected to said motor and in engagement with said purging station, wherein said motor is operable to rotate said threaded shaft which results in up and down movement of said purging station;
   a transverse drive unit for moving said adhesive applying nozzle, relative to said support unit and said purging station, in a direction which is perpendicular to the vertical direction so as to position said adhesive applying nozzle relative to support unit and said purging station; and
   a control means operably connected to said elevation drive unit for controlling said elevation drive unit via a command in order to set the lowermost position of said adhesive applying nozzle,
   wherein said reversible motor of said elevation drive unit is operable in response to the command from said control means resulting in rotation of said cam, which moves said cam follower on the cam surface of said cam so that said shaft is moved downward and said adhesive applying nozzle is moved to a selected lowermost position.

2. An adhesive applying apparatus as claimed in claim 1, wherein said support unit supports said circuit board, and a lower surface of the circuit board serves as a reference so that the height of the upper surface of said circuit board is changed each time a thickness of the circuit board is varied.

3. An adhesive applying apparatus comprising:
   a support unit for supporting a circuit board;
   an adhesive applying nozzle for applying adhesive onto an upper surface of the circuit board;
   an elevation drive unit connected to said adhesive applying nozzle for moving said adhesive applying nozzle up and down along a vertical direction;
   a purging station having an upper surface for receiving a purging tape thereon;
   a transverse drive unit for moving said adhesive applying nozzle relative to said support unit and said purging station so as to position the adhesive applying nozzle in a specified position along a transverse direction which is perpendicular to the vertical direction;
   a station elevation unit for selectively moving said purging station up and down; and
   a control means for controlling said station elevation unit via a command in order to position the upper surface of said purging station at a selected height.

4. An adhesive applying apparatus as claimed in claim 3, wherein the command from said control means varies depending upon a thickness of the circuit board, and the selected position of said upper surface of said purging station is selected in accordance with the thickness of the circuit board.

5. An adhesive applying apparatus as claimed in claim 4, wherein said station elevation unit comprises:
   a motor; and
   a threaded shaft in threaded engagement with said purging station and rotatably connected to said motor, so that said motor is operable to rotate said threaded shaft which moves said purging station up and down along a vertical direction.

6. An adhesive applying apparatus as claimed in claim 4, wherein a lower surface of the circuit board, when supported by said support unit, serves as a reference so that the height of the upper surface of the circuit board corresponds to the thickness of the circuit board supported on said support unit.

7. An adhesive applying apparatus as claimed in claim 3, wherein said station elevation unit comprises:
   a motor; and
   a threaded shaft in threaded engagement with said purging station and rotatably connected to said motor, so that said motor is operable to rotate said threaded shaft which moves said purging station up and down along a vertical direction.

8. An adhesive applying apparatus as claimed in claim 3, wherein a lower surface of the circuit board, when supported by said support unit, serves as a reference so that the height of the upper surface of the circuit board corresponds to the thickness of the circuit board supported on said support unit.

* * * * *